United States Patent
Park et al.

(10) Patent No.: US 9,485,857 B2
(45) Date of Patent: Nov. 1, 2016

(54) FLAT PANEL DISPLAY APPARATUS AND METHOD FOR MANUFACTURING THE SAME

(71) Applicant: Samsung Display Co., Ltd., Yongin (KR)

(72) Inventors: Dae-Jin Park, Yongin (KR); Bum-Soo Kam, Yongin (KR); Ha-Young Park, Yongin (KR); Gil-Hwan Yeo, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 270 days.

(21) Appl. No.: 14/134,467

(22) Filed: Dec. 19, 2013

(65) Prior Publication Data

US 2015/0029684 A1 Jan. 29, 2015

(30) Foreign Application Priority Data

Jul. 25, 2013 (KR) ........................ 10-2013-0088106

(51) Int. Cl.
*G02F 1/1345* (2006.01)
*H05K 1/02* (2006.01)
*H01L 27/12* (2006.01)
*H05K 3/40* (2006.01)
*H05K 3/00* (2006.01)

(52) U.S. Cl.
CPC ........... *H05K 1/028* (2013.01); *G02F 1/13452* (2013.01); *H01L 27/124* (2013.01); *H01L 27/1262* (2013.01); *H05K 3/403* (2013.01); *H05K 3/4092* (2013.01); *H05K 3/0044* (2013.01); *H05K 2201/0397* (2013.01); *H05K 2201/10136* (2013.01); *H05K 2203/0228* (2013.01); *H05K 2203/107* (2013.01)

(58) Field of Classification Search
CPC ... G02F 1/13452; H05K 1/189; H05K 1/118
USPC .......................................... 349/150; 361/749
See application file for complete search history.

(56) References Cited

U.S. PATENT DOCUMENTS 5,777,610 A * 7/1998 Sugimoto ............... H05K 1/147 29/854
2008/0211754 A1* 9/2008 Park ..................... G09G 3/3648 345/87

FOREIGN PATENT DOCUMENTS

| JP | 2002-289764 | 10/2002 |
|---|---|---|
| JP | 2012-078570 | 4/2012 |
| KR | 10-2000-0052180 | 8/2000 |
| KR | 10-2003-0072795 | 9/2003 |
| KR | 10-2008-0092110 | 10/2008 |
| KR | 10-2011-0064287 | 6/2011 |
| KR | 10-2011-0068169 | 6/2011 |

* cited by examiner

*Primary Examiner* — Thanh-Nhan P Nguyen
(74) *Attorney, Agent, or Firm* — H.C. Park & Associates, PLC

(57) ABSTRACT

A flat panel display apparatus for reducing a bezel size and a method for manufacturing the same. The flat panel display apparatus includes a lower substrate having a display area and a peripheral area surrounding the display area, an upper substrate corresponding to the lower substrate, a sealing member disposed along the peripheral area of the lower substrate and bonding the lower substrate and the upper substrate, a first flexible layer disposed on a surface of the lower substrate in a direction facing the upper substrate, in the peripheral area of the lower substrate, the first flexible layer extending to an outside of the lower substrate, and a first wiring disposed between the lower substrate and the sealing member and extending to the outside of the lower substrate and along the first flexible layer.

12 Claims, 7 Drawing Sheets

FLAT PANEL DISPLAY APPARATUS AND METHOD FOR MANUFACTURING THE SAME

CROSS-REFERENCE TO RELATED APPLICATION

This application claims the benefit from and the benefit of Korean Patent Application No. 10-2013-0088106, filed on Jul. 25, 2013, which is hereby incorporated by reference for all purposes as if fully set forth herein.

BACKGROUND

1. Field

Exemplary embodiments of the present invention relate to a flat panel display apparatus and a method for manufacturing the same, and more particularly, to a flat panel display apparatus having a reduced bezel size and a method for manufacturing the same.

2. Discussion of the Background

In general, a flat panel display apparatus has a display device disposed between first and second substrates opposing each other. A liquid crystal display apparatus or an organic light-emitting display apparatus is a type of flat panel display apparatus.

The first substrate of the typical flat panel display apparatus has a greater area than that of the second substrate. This is because wiring for transferring an electrical signal to be applied to a display device is disposed on a part of the first substrate corresponding to an outer side of the second substrate, and a pad unit disposed on an end portion of the wiring is also disposed on the part of the first substrate corresponding to the outer side of the second substrate.

Therefore, according to the typical flat panel display apparatus, an area of a peripheral region at an outer side of a region where display devices are arranged, i.e., a display region, is increased. Thus, an area of a dead space where an image is not displayed is undesirably large, as well as the size of a bezel arranged on the dead space.

The above information disclosed in this Background section is only for enhancement of understanding of the background of the invention and, therefore, it may contain information that does not form the prior art that is already known in this country to a person of ordinary skill in the art.

SUMMARY

Exemplary embodiments of the present invention provide a flat panel display apparatus having a reduced bezel size, and a method for manufacturing the same.

Additional features will be set forth in the description which follows and, in part, will be apparent from the description, or may be learned by practice of the invention.

An exemplary embodiment of the present invention discloses a flat panel display apparatus including a lower substrate having a display area and a peripheral area surrounding the display area, an upper substrate corresponding to the lower substrate, a sealing member disposed along the peripheral area of the lower substrate and bonding the lower substrate to the upper substrate, a first flexible layer disposed in a peripheral area of a surface of the lower substrate. The surface of the lower substrate faces toward the upper substrate and the first flexible layer is extended to the outside of the lower substrate. A first wiring is disposed between the lower substrate and the sealing member and extended to the outside of the lower substrate on the first flexible layer.

An exemplary embodiment of the present invention also discloses a method for manufacturing a flat panel display apparatus including forming a trench in at least a part of a peripheral area surrounding a display area of a first base substrate; disposing a first flexible layer in trench, forming a first wiring and a thin film transistor in the display area of the first base substrate, the first wiring being disposed on the first flexible layer and electrically connected to the thin film transistor, bonding the first base substrate to a second base substrate using a sealing member disposed on the peripheral area of the first base substrate, and removing a part of the peripheral area of the first base substrate so that only a part of the first flexible layer nearest the display area is supported by the first base substrate.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

Figure 1:
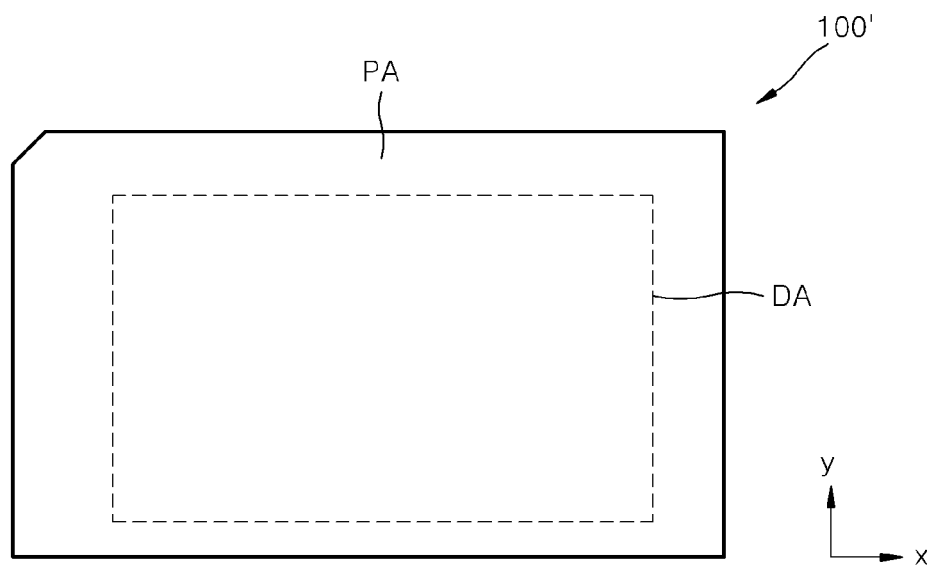
FIGS. 1 and 2 are plan views schematically illustrating a manufacturing process of a flat panel display apparatus according to an exemplary embodiment of the present invention.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure is thorough, and will fully convey the scope of the invention to those skilled in the art Like reference numerals in the drawings denote like elements. As used herein, the term "and/or" includes any and all combinations of one or more of the associated listed items. Expressions such as "at least one of," when preceding a list of elements, modify the entire list of elements and do not modify the individual elements of the list.

Sizes and relative sizes of elements in the drawings may be exaggerated for convenience of explanation. In other words, since sizes and thicknesses of components in the drawings are arbitrarily illustrated for convenience of explanation, the following exemplary embodiments are not limited thereto.

In the following examples, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

It will be understood that when a layer, region, or component is referred to as being "formed on," another layer, region, or component, it can be directly or indirectly formed on the other layer, region, or component, or intervening layers, regions, or components may be present. In contrast, when a layer, region, or component is referred to as being "directly coupled" to another layer, region, or component, there are no intervening layers, regions, or components present. It will be understood that for the purposes of this disclosure, "at least one of X, Y, and Z" can be construed as X only, Y only, Z only, or any combination of two or more items X, Y, and Z (e.g., XYZ, XYY, YZ, ZZ).

Figure 2:
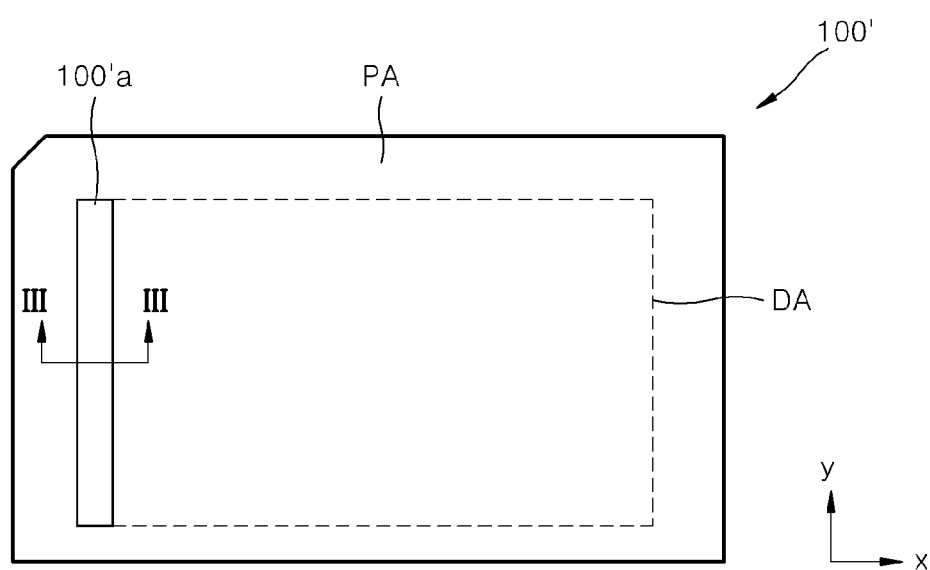

FIGS. 1 and 2 are plan views schematically illustrating a manufacturing process of a flat panel display apparatus according to an exemplary embodiment of the present invention.

A first base substrate 100', as illustrated in FIG. 2, is prepared, the first base substrate 100' having a display area DA, a peripheral area PA surrounding the display area DA, and a trench 100'a formed in at least a part of the peripheral area PA. The first base substrate 100' is later cut to be a lower substrate of the flat panel display apparatus. FIG. 2 is a planar view exemplarily illustrating the trench 100'a formed at a part of the peripheral area PA which is adjacent to a left side of the display area DA of the first base substrate 100'.

Figure 3:
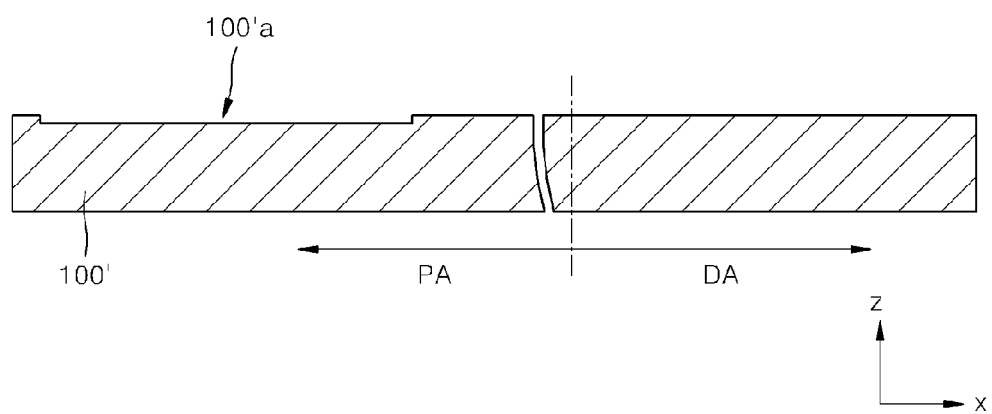
FIGS. 3, 4, 5, 6, 7, 8, and 9 are cross-sectional views schematically illustrating a manufacturing process of a flat panel display apparatus according to an exemplary embodiment of the present invention.

The first base substrate 100' may be prepared in various ways. For example, as illustrated in FIG. 1, the first base substrate 100' may be covered with a protective layer so that only a part of the first base substrate 100', where the trench 100'a is to be formed, is exposed. The protective layer may be formed of, for example, a photoresist. Thereafter, the exposed part of the first base substrate 100' is etched using a hydrofluoric (HF) acid so that the trench 100'a is formed to have a preset depth on the first base substrate 100'. The protective layer is removed later. FIG. 3 is a cross-sectional view of the first base substrate 100' taken along the line III-III of FIG. 2. FIG. 3 illustrates the trench 100'a formed in at least a part of the peripheral area PA of the first base substrate 100'. The first base substrate 100' may be formed of a glass material, a metal material, and/or a plastic material.

Figure 4:
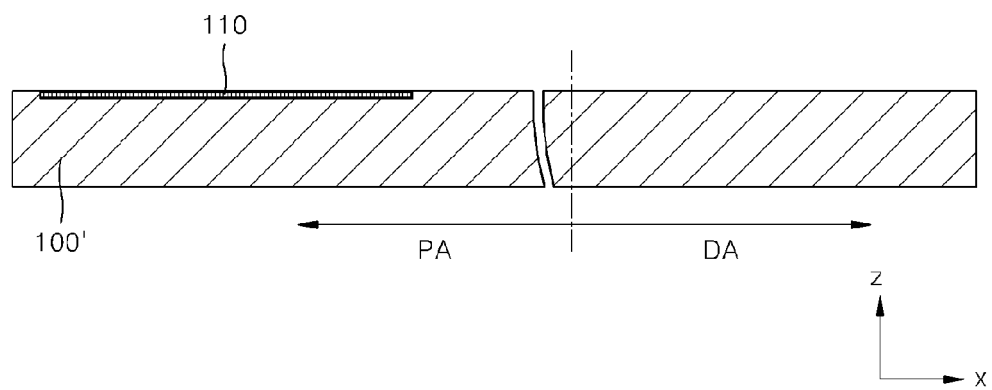

Thereafter, as illustrated in FIG. 4, a first flexible layer 110 is disposed in the trench 100'a of the first base substrate 100'. The first flexible layer 110 may be formed in various ways. For example, a material for the first flexible layer 110 is disposed in the trench 110'a using an inkjet printing method, and the material is then hardened. Alternatively, the first flexible layer 110 may be pre-formed so as to correspond to a shape of the trench 100'a, and may be disposed in the trench 100'a using a lamination method. While the first flexible layer 110 is disposed in the trench 100'a of the first base substrate 100', the first flexible layer 110 may be fixed to the first base substrate 100', as necessary, using an adhesive.

The first flexible layer 100 may be formed using, for example, polyimide. Because a laser beam is radiated to the first flexible layer 110 during a later process, the first flexible layer 110 may be formed of a material capable of enduring heat of the laser beam. Therefore, the first flexible layer 110 formed of the polyimide may have excellent heat resistance.

Figure 5:
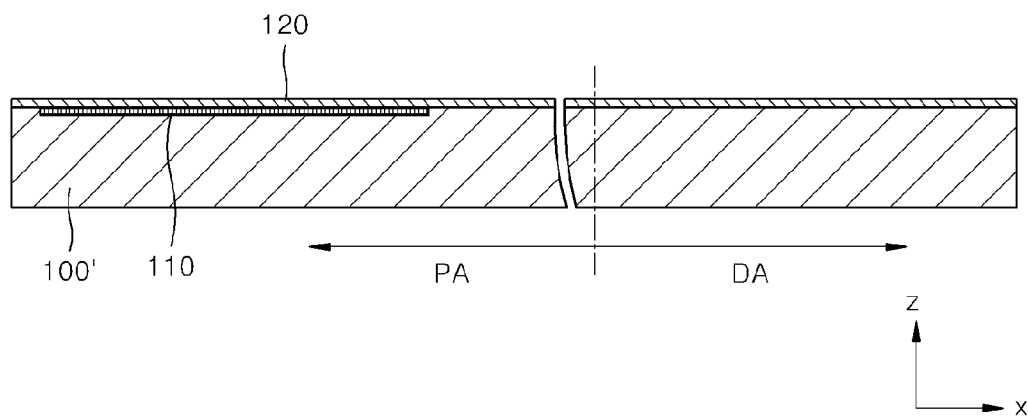

Thereafter, as illustrated in FIG. 5, an organic layer 120 is formed so as to cover the first flexible layer 110 and at least a part of the peripheral area PA of the first base substrate 100'. As illustrated in FIG. 5, the organic layer 120 may be formed so as to cover the entire peripheral area PA of the first base substrate 100' and the display area DA of the first base substrate 100'. The organic layer 120 may serve as a planarizing layer for planarizing a part of the peripheral area PA covered by the organic layer 120. That is, the organic layer 120 may serve as the planarizing layer for covering at least a part of the peripheral area PA of the first base substrate 100' and at least a part of an upper surface of the first flexible layer 110. The upper surface of the first flexible layer 110 faces away from the first base substrate 100'. Acrylic resin may be used to form the organic layer 120.

If an upper surface of the first flexible layer 110 formed in the trench 100'a of the first base substrate 100' and an upper surface of the first base substrate 100', with the exception of the trench 100'a, are sufficiently smooth, the forming of the organic layer 120 may be omitted.

Figure 6:
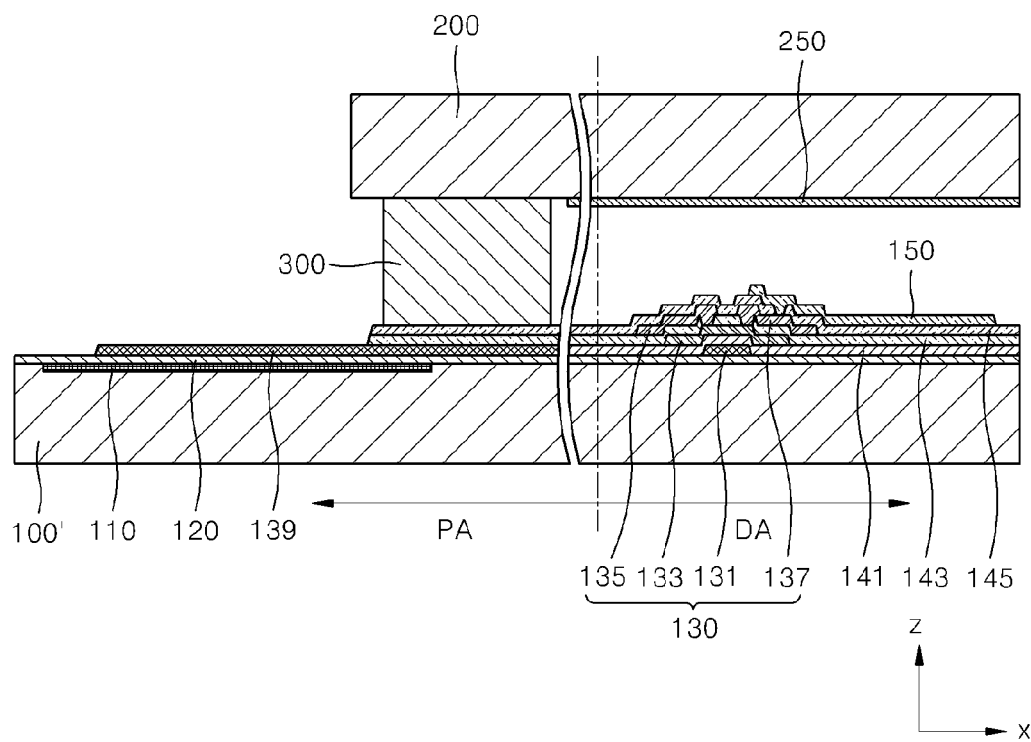

Thereafter, as illustrated in FIG. 6, a thin film transistor 130 is formed in the display area DA of the first base substrate 100', and a first wiring 139 is formed on the first flexible layer 110. In the case where the organic layer 120 is formed, the first wiring 139 is formed on the organic layer 120 formed on the first flexible layer 110.

The first wiring 139 may be electrically connected to the thin film transistor 130 in the display area DA of the first base substrate 100'. The first wiring 139 may be formed at the same time that the thin film transistor 130 is formed in the display area DA of the first base substrate 100'. That is, the first wiring 139 may be formed at the same time that a gate electrode 131, a source electrode 135, and a drain electrode 137 of the thin film transistor 130 are formed.

Referring to FIG. 6, the gate electrode 131 is disposed at a lower part of the thin film transistor 130. The source electrode 135 and the drain electrode 137 are disposed on the gate electrode 131, and a semiconductor layer 133 is disposed between the gate electrode 131 and the source and drain electrodes 135 and 137. The gate electrode 131 is disposed on the same layer as the first wiring 139. In this case, the first wiring 139 and the gate electrode 131 may be formed of the same material and at the same time. The first wiring 139 may be formed so as to have a pad unit at an end portion of the first wiring 139.

In addition, a gate insulating layer 141 for insulating the gate electrode 131 and the semiconductor layer 133, an interlayer insulating layer 143 disposed between the semiconductor layer 133 and the source and drain electrodes 135 and 137, and a protective layer 145 for covering the thin film transistor 130 may be formed, as illustrated in FIG. 6.

A display device may also be formed in the display area DA of the first base substrate 100'. In the case where the flat panel display apparatus is a liquid crystal display apparatus, a pixel electrode 150 electrically connected to the thin film transistor 130 may be formed, as illustrated in FIG. 6. In the case where the flat panel display apparatus is an organic light-emitting display apparatus, the pixel electrode 150 electrically connected to the thin film transistor 130 may be formed. In addition, a pixel defining layer covering the pixel electrode 150 may be formed so that a center part of the pixel electrode 150 is exposed. Thereafter, an intermediate layer (not shown), including at least an emission layer (not shown), may be formed on the pixel electrode 150, and then, an opposite electrode 250 may be formed so that the intermediate layer is disposed between pixel electrodes.

Referring to FIG. 6, the interlayer insulating layer 143 and the protective layer 145 of the display area DA extend to a region under a sealing member 300, but the gate insulating layer 141 does not extend thereto. However, this is merely an illustration, and various modifications may be made thereto. For example, the gate insulating layer 141 may extend to the region under the sealing member 300, and at least one of the interlayer insulating layer 143 and the protective layer 145 may not extend thereto. Furthermore, at least one of the gate insulating layer 141, the interlayer insulating layer 143, and the protective layer 145 may extend to pass through the region under the sealing member 300 and cover at least a part of the first wiring 139.

Thereafter, the first base substrate 100' and the second base substrate 200 are bonded using the sealing member 300 disposed along the peripheral area PA of the first base substrate 100'. The sealing member 300 may be a glass frit. In the case where the flat panel display apparatus is a liquid crystal display apparatus, an opposite electrode 250 may be formed on the second base substrate 200. In this case, the first base substrate 100' and the second base substrate 200 may be bonded, so that the opposite electrode 250 faces the first base substrate 100'. Furthermore, a liquid crystal (not shown) may be injected into a gap between the first base substrate 100' and the second base substrate 200.

Because the first base substrate 100' and the second base substrate 200 are bonded using the sealing member 300, the first wiring 139 is disposed between the first base substrate 100' and the sealing member 300 and extends along the first flexible layer 110 to pass outside of the sealing member 300.

Figure 8:
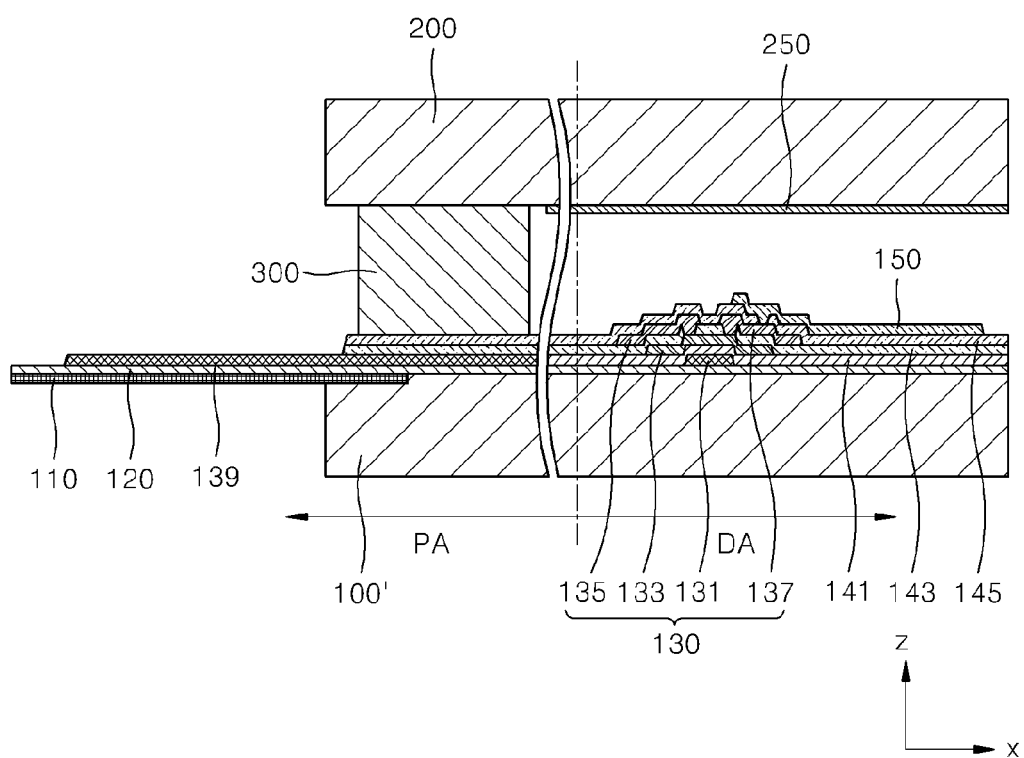

Thereafter, as illustrated in FIG. 8, a part of the peripheral area PA of the first base substrate 100' is removed so that only a part of the first flexible layer 110, which faces in a direction toward the display area DA (+x direction) of the first base substrate 100', is supported by the first base substrate 100'. This process may be performed by cutting the first base substrate 100' using a cutting tool such as a cutter. The remaining part of the first base substrate 100' may be referred to as a lower substrate 100 of the flat panel display apparatus. The cut part of the first base substrate 100' is in a region corresponding to the first flexible layer 110 of the first base substrate 100'.

Figure 7:
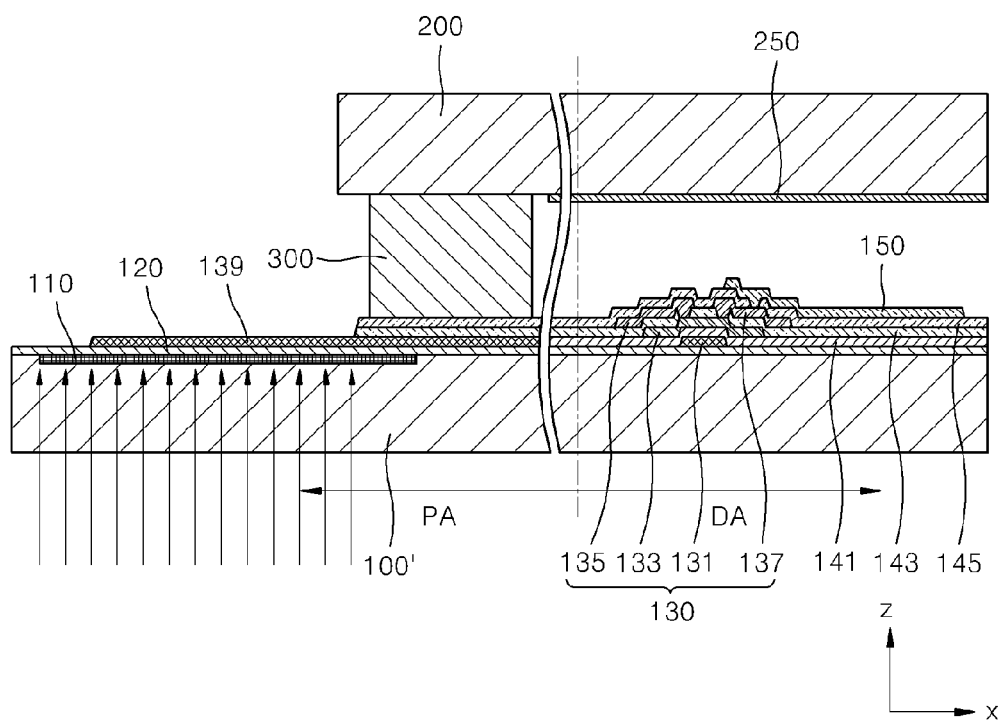

The part of the first base substrate 100' to be cut may not be cleanly separated from the first flexible layer 110 when cut as a result of the bonding strength between the part of the first base substrate 100' to be cut and the first flexible layer 110. Therefore, as illustrated in FIG. 7, a laser beam may be radiated to the first flexible layer 110 as necessary, prior to performing the cutting, to thereby weaken the bonding strength between the part of the first flexible layer 110 and the first base substrate 100'. In detail, as illustrated in FIG. 7, the laser beam may be radiated to the first flexible layer 110 so as to deteriorate part of the first flexible layer 110, or decompose or ash elements of the first flexible layer 110. Therefore, the bonding strength between the cut part of the first base substrate 100' and the first flexible layer 110 may be weakened.

The laser beam may be radiated to the part of the first flexible layer 110 corresponding to the part of the first base substrate 100' to be removed so that a part of a surface of the first flexible layer 110 facing the first base substrate 100' and radiated with the laser beam is deteriorated, or elements thereof are decomposed or ashed. Because the part of the surface of the first flexible layer 110 facing the first base substrate 100' and radiated with the laser beam is deteriorated, the bonding strength between the first flexible layer 110 and the first base substrate 100' is significantly weakened at that part. Therefore, when the part of the peripheral area PA of the first base substrate 100' is removed, the first flexible layer 110 may remain undamaged. The bonding strength between the first flexible layer 110 and the first base substrate 100' is maintained at the part of the first flexible layer 110 not irradiated with the laser beam. Therefore, as illustrated in FIG. 8, the first flexible layer 110 is still bonded to the lower substrate 100. In an exemplary embodiment, the laser beam may have a wavelength of about 308 nm, for example.

As illustrated in FIG. 8, because the laser beam partially irradiates the first flexible layer 110, a part of the first flexible layer 110 is supported by the lower substrate 100. As a result, the remaining part of the first flexible layer 110 is not supported by the lower substrate 100.

In the description above the second base substrate 200 is not cut. However, exemplary embodiments of the present invention are not limited thereto. Although not shown in the exemplary embodiment of FIG. 6, the second base substrate 200 may protrude to the outer side of the sealing member 300 and, in that case, the second base substrate 200 may also be cut. The cutting of the second base substrate 200 may be performed prior to the cutting of the first base substrate 100' or the irradiation of the first flexible layer 110 by the laser beam. The cut second base substrate 200 may be referred to as an upper substrate of the flat panel display apparatus. In the case in which the second base substrate 200 has an appropriate size and does not need to be cut, the second base substrate 200 may be referred to as an upper substrate 200 of the flat panel display apparatus.

Figure 9:
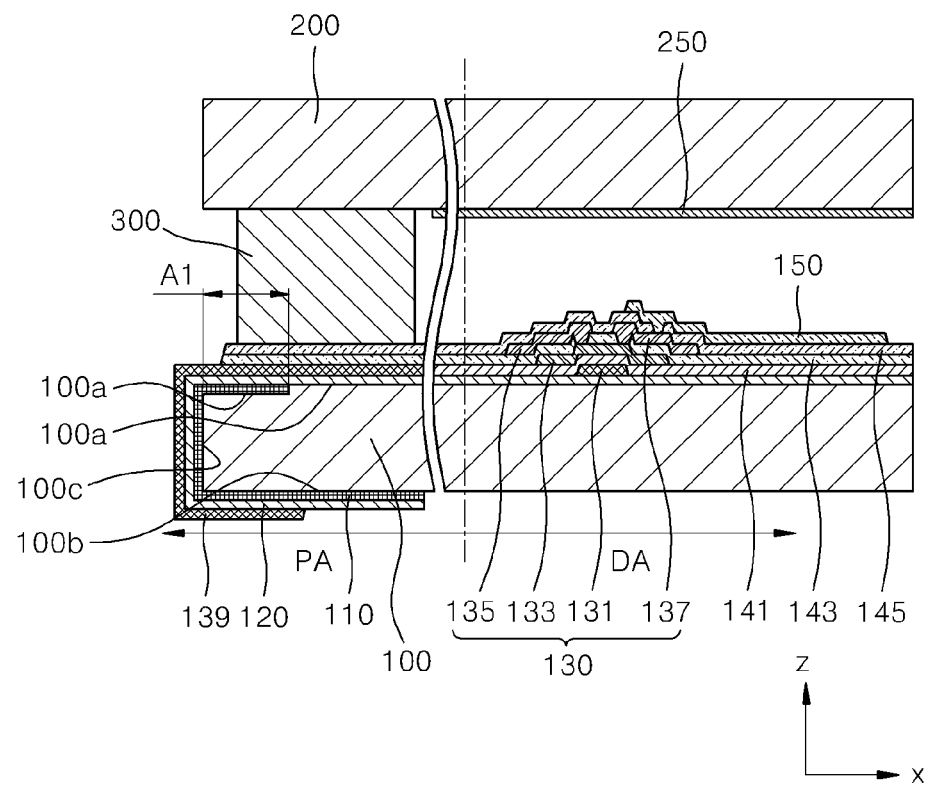

Thereafter, as illustrated in FIG. 9, the first flexible layer 110 may be bent. In detail, the first flexible layer 110 may be bent multiple times at multiple locations, so that the first flexible layer 110 is disposed on a surface of the first substrate facing the second base substrate 200. In particular, the first flexible layer 110 is disposed on a first surface 100a of the lower substrate 100 facing the upper substrate 200, a second surface 100b opposite to the first surface 100a, and a side surface 100c connecting the first surface 100a and the second surface 100b. Therefore, the pad unit of the first wiring 130 may be disposed on a part of the first flexible layer 110 on the second surface 100b of the lower substrate 100.

A typical flat panel display apparatus has first and second substrates opposing each other, and an area of the first substrate is greater than that of the second substrate. This is because wiring for transferring an electrical signal to be applied to a display device of a display area of the first substrate is disposed on a part of the first substrate corresponding to an outer side of the second substrate, and a pad unit disposed on an end portion of the wiring is also disposed on the part of the first substrate corresponding to the outer side of the second substrate.

Therefore, according to the typical flat panel display apparatus, an area of a peripheral region at an outer side of a region where display devices are arranged, i.e., a display region, increases. Thus, an area of a dead space where an image is not displayed increases and a size of a bezel arranged on the dead space also increases.

However, according to the present exemplary method for manufacturing the flat panel display apparatus, the areas of the lower substrate 100 and the upper substrate 200 may be almost equal in a manufactured flat panel display apparatus. This is because the first wiring 130 for applying an electrical signal to a display device extends along the first flexible layer 110, and the first flexible layer 110 is bent so as to contact the side surface 100c of the lower substrate 100 and extend onto the second surface 100b of the lower substrate 100. Therefore, a region for the pad unit that occupies a significant portion of the dead space need not be prepared on the first surface 100a of the lower substrate 100. Thus, a bezel size of the flat panel display apparatus may be dramatically reduced and a bezel-less appearance for the flat panel display apparatus may be implemented.

The flat panel display device is typically provided with a horizontal driving circuit unit and a vertical driving circuit unit (not shown). If the vertical driving circuit unit is disposed along an edge of one side of the lower substrate 100, the horizontal driving circuit unit is adjacent to the edge of the one side of the lower substrate 100 and is disposed along an edge of the other side vertical to the edge of the one side. Therefore, pads for applying electrical signals to the vertical driving circuit unit and the horizontal driving circuit unit are also disposed adjacent to the vertical driving circuit unit and the horizontal driving circuit unit, respectively.

As described above, according to the typical flat panel display apparatus, the first substrate has a portion that protrudes to the outer side of the second substrate, and thus, the first substrate has an area greater than that of the second substrate, wherein pads are disposed only on two adjacent sides from among four sides of the first substrate. However, because the display area should be arranged on a center part of the flat panel display apparatus, the two other sides of the first substrate should have portions that protrude to the outer side of the second substrate, even though the pads are not disposed on the two other sides. As a result, an area of the dead space increases with respect to the entire area of the flat panel display apparatus.

However, in the present exemplary flat panel display apparatus, the areas of the lower substrate 100 and the upper substrate 200 may be almost equal. Thus, the dead space may be dramatically reduced.

For reference, FIG. 9 illustrates the first flexible layer 110 extending on the outside of the lower substrate 100, the organic layer 120 on the first flexible layer 110, and the first wiring 139, as if a total thickness of the first flexible layer 110, the organic layer 120, and the first wiring 139 is very large. However, this is merely an illustration for convenience. A thickness of the lower substrate 100 or the upper substrate 200 may be from about 0.3 mm to about 0.6 mm. However, the thickness of each of the first flexible layer 110, the organic layer 120, and the first wiring 139 is from about 10 μm to about 30 μm. Therefore, even though the areas of the lower substrate 100 and the upper substrate 200 are equal, the thicknesses of the first flexible layer 110 on the side surface 100c of the lower substrate 100, the organic layer 120 on the first flexible layer 110, and the first wiring 139 are insignificant.

Figure 10:
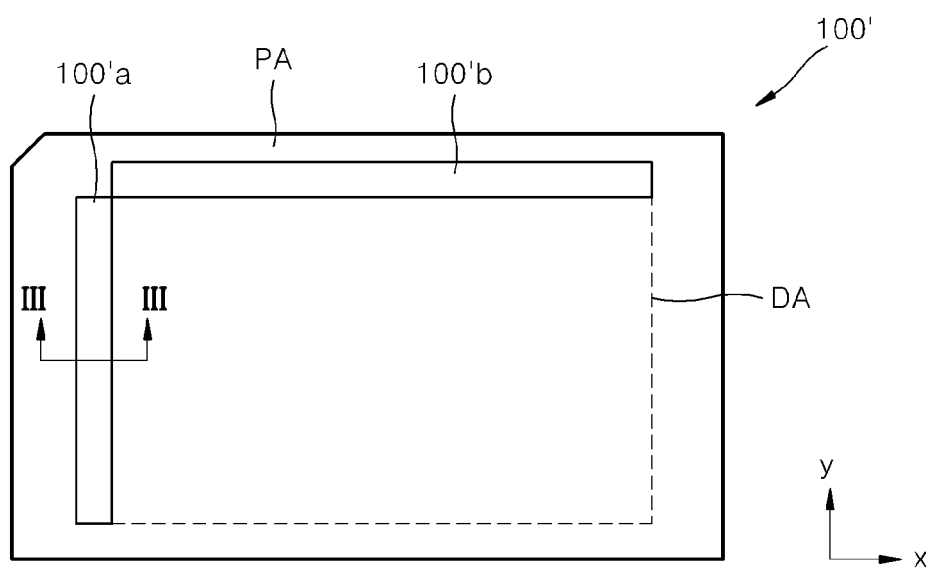
FIG. 10 is a plan view schematically illustrating one process of manufacturing a flat panel display apparatus according to another exemplary embodiment of the present invention.

FIG. 2 illustrates one trench 100'a formed in a portion of the peripheral area PA which is adjacent to one side of the display area DA of the first base substrate 100'. However, exemplary embodiments of the present invention are not limited thereto. As illustrated in FIG. 10, which is a plan view illustrating one process of a method for manufacturing a flat panel display apparatus according to another exemplary embodiment of the present invention, another trench 100'b may be formed on a portion of the peripheral area PA which is adjacent to the other side of the display area DA of the first base substrate 100'. In this case, a second flexible layer (not shown) may be formed on the trench 100'b, and then a second wiring (not shown) may be formed so as to extend along the second flexible layer in a manner similar to the process of forming the first flexible layer 110 on the trench 100'a. The first wiring 139 extending along the first flexible layer 110 is then formed. Shapes and/or structures of the second flexible layer and the second wiring may be the same as or similar to shapes and/or structures of the first flexible layer 110 and the first wiring 139. The second flexible layer may be formed of the same material as that of the first flexible layer 110 at the same time that the first flexible layer 110 is formed, and the second wiring may be formed of the same material as that of the first wiring at the same time that the first wiring 139 is formed.

Although that the manufacture of only one flat panel display apparatus is described above, a plurality of flat panel display apparatuses may be simultaneously manufactured by forming a plurality of display units on the first base substrate 100'.

Although the method for manufacturing the flat panel display apparatus has been described, exemplary embodiments of the present invention are not limited thereto. A flat panel display apparatus according to an exemplary embodiment of the present invention may have the structure illustrated in FIG. 9. In detail, the flat panel display apparatus according to the present exemplary embodiment includes a lower substrate 100 having a display area DA and a peripheral area PA surrounding the display area DA, an upper substrate 200 corresponding to the lower substrate 100, and a sealing member 300 disposed along the peripheral area PA of the lower substrate 100 and bonding the lower substrate 100 to the upper substrate 200.

Furthermore, the flat panel display apparatus according to the present exemplary embodiment includes a first flexible layer 110 and a first wiring 139. The flexible layer 110 is disposed on a first surface of the lower substrate 100 facing the upper substrate 200 and extends to the outside of the lower substrate 100 in the peripheral area PA of the lower substrate 100. The first wiring 139 is disposed between the lower substrate 100 and the sealing member 300 and extends to the outside of the lower substrate 100 along the first flexile layer 110. In detail, the first wiring 139 extends to the outside of the lower substrate 100 along an upper surface of the first flexible layer 110. Here, the upper surface of the first flexible layer is a surface of the first flexible layer faces away from the lower substrate 100. The first wiring 139 may have a pad unit at an end portion thereof.

A typical flat panel display apparatus has first and second substrates opposing each other, wherein an area of the first substrate is greater than that of the second substrate. This is because wiring for transferring an electrical signal to be applied to a display device of a display area of the first substrate is disposed on a part of the first substrate corresponding to an outer side of the second substrate, and a pad unit disposed on an end portion of the wiring is also disposed on the part of the first substrate corresponding to the outer side of the second substrate.

Therefore, according to the typical flat panel display apparatus, an area of a peripheral region at an outer side of a region where display devices are arranged, i.e., a display region, increases. Thus, an area of a dead space where an image is not displayed increases, and a size of a bezel arranged on the dead space also increases.

However, according to the flat panel display apparatus according to the exemplary embodiments, the areas of the lower substrate 100 and the upper substrate 200 may be almost the same. This is because the first wiring 130 for applying an electrical signal to a display device extends not only to the lower substrate 100, but also to the outside of the lower substrate 100 along the first flexible layer 110. Thus, the size of the lower substrate 100 need not be increased. Therefore, a region for the pad unit and the pad unit which occupy a significant portion of the dead space need not be prepared on a first surface 100a of the lower substrate 100. Thus, a bezel size of the flat panel display apparatus may be dramatically reduced and a bezel-less appearance for the flat panel display apparatus may be implemented.

The lower substrate 200 has the first surface 100a which faces toward the upper substrate 200 (+z direction) and a second surface 100b which faces in a direction opposite to the +z direction (−z direction). A distance between the first surface 100a and the second surface 100b in a first area A1 that is at least a part of an edge of the lower substrate 100 may be less than that between the first surface 100a and the second surface 100b in the display area DA of the lower substrate 100. As illustrated in FIG. 9, the first area A1 may extend to a side surface 100c connecting the first surface 100a and the second surface 100b of the lower substrate 100. Therefore, a part of the first flexible layer 110 in the peripheral area PA of the lower substrate 100 may correspond to the first area A1 of the lower substrate 100. That is, the part of the first flexible layer 110 in the peripheral area PA of the lower substrate 100 may contact the first surface 100a of the lower substrate 100 in the first area A1. This is for planarizing an upper surface of the first flexible layer 110 and the first surface 100a of the lower substrate 100, with the exception of portions thereof in the first area A1.

Furthermore, an organic layer 120 covering the first flexible layer 110 and at least a part of the peripheral area PA of the lower substrate 100 may be provided, in order to improve flatness of the upper surface of the first flexible layer 110 and the first surface 100a of the lower substrate 100, with the exception of portions thereof in the first area A1. In this case, a part of the first wiring 139 on the first flexible layer 110 is disposed on the organic layer 120.

As illustrated in FIG. 9, the organic layer 120 may cover the entirety of the peripheral area PA of the lower substrate 100 and the display area DA of the lower substrate 100. The organic layer 120 may serve as a planarizing layer for planarizing a part of the peripheral area PA which is covered by the organic layer 120. That is, the organic layer 120 may serve as the planarizing layer for covering at least a part of the peripheral area PA of the lower substrate 100 and at least a part of an upper surface of the first flexible layer 110. Here, the upper surface of the first flexible layer 110 is a surface of the first flexible layer 110 that faces away from the lower substrate 100. The organic layer 120 may include acrylic resin.

An adhesive (not illustrated) may be disposed between the part of the first flexible layer 110 in the peripheral area PA of the lower substrate 100 and the first surface 100a of the lower substrate 100 in the first area A1. The adhesive may serve to improve bonding strength between the first flexible layer 110 and the lower substrate 100.

The first flexible layer 110 may be bent, as illustrated in FIG. 9, so as to be disposed along the first surface 100a, the side surface 100c, and the second surface 100b of the lower substrate 100. Therefore, the pad unit of the end portion of the first wiring 130 may be disposed on a part of the first flexible layer 110 on the second surface 100b of the lower substrate 100. A driving chip may be mounted on the pad unit of the end portion of the first wiring 139, in order to apply a signal for controlling an operation of a display device disposed in the display area DA of the lower substrate 100 to the display device through the first wiring 139. A printed circuit board may be connected to the pad unit of the end portion of the first wiring 139.

As described above, according to the exemplary embodiments of the present invention, a flat panel display apparatus for reducing a bezel size and a method for manufacturing the same may be implemented. However, exemplary embodiments of the present invention are not limited thereto.

It should be understood that the exemplary embodiments described therein should be considered in a descriptive sense only and not for purposes of limitation. Descriptions of features or aspects within each exemplary embodiment should typically be considered as available for other similar features or aspects in other exemplary embodiments.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A display apparatus, comprising:
 a lower substrate comprising a display area and a peripheral area surrounding the display area;
 an upper substrate facing the lower substrate;
 a sealing member disposed along the peripheral area of the lower substrate and bonding the lower substrate to the upper substrate;
 a first flexible layer disposed on a surface of the lower substrate, in the peripheral area, and extending outside of the lower substrate, the surface of the lower substrate facing the upper substrate; and
 a first wiring disposed between the lower substrate and the sealing member, the first wiring extending outside of the lower substrate on the first flexible layer such that a portion of the first flexible layer is interposed between the first wiring and the lower substrate.

2. The display apparatus of claim 1, wherein the first wiring extends outside of the lower substrate along a surface of the first flexible layer, the surface of the first flexible layer facing away from the lower substrate.

3. The display apparatus of claim 1, wherein:
 the lower substrate comprises a first surface that faces the upper substrate, an opposing second surface which faces away from the upper substrate, and a side surface connecting the first surface and the second surface; and
 the first flexible layer is bent so as to extend along the first surface, the side surface, and the second surface.

4. The display apparatus of claim 3, wherein the first wiring comprises a pad unit disposed at an end portion thereof, the pad unit being disposed on a part of the first flexible layer that is disposed on the second surface of the lower substrate.

5. The display apparatus of claim 1, further comprising an organic layer covering the first flexible layer and at least a part of the peripheral area of the lower substrate.

6. The apparatus of claim 5, wherein the organic layer is a planarizing layer that planarizes at least a part of the peripheral area of the lower substrate and at least a part of a surface of the first flexible layer that faces away from the lower substrate.

7. The display apparatus of claim 5, wherein a part of the first wiring facing the first flexible layer is disposed on the organic layer.

8. A display apparatus, comprising:
 a lower substrate comprising a display area and a peripheral area surrounding the display area;
 an upper substrate facing the lower substrate;
 a sealing member disposed along the peripheral area of the lower substrate and bonding the lower substrate to the upper substrate;
 a first flexible layer disposed on a surface of the lower substrate, in the peripheral area, and extending outside of the lower substrate, the surface of the lower substrate facing the upper substrate; and a first wiring disposed between the lower substrate and the sealing member, the first wiring extending outside of the lower substrate on the first flexible layer, wherein:

the lower substrate comprises a first surface that faces the upper substrate, and an opposing second surface which faces away from the upper substrate; and a thickness of the lower substrate in a first area of the lower substrate that is at least a part of the peripheral area of the lower substrate is less than a distance between the first surface and the second surface in the display area of the lower substrate.

9. The display apparatus of claim 8, wherein the first area of the lower substrate extends to a side surface connecting the first surface and the second surface of the lower substrate.

10. The display apparatus of claim 8, wherein a part of the first flexible layer in the peripheral area of the lower substrate faces the first area of the lower substrate.

11. The display apparatus of claim 10, wherein the part of the first flexible layer in the peripheral area of the lower substrate contacts the first surface of the lower substrate in the first area of the lower substrate.

12. The display apparatus of claim 11, wherein an adhesive is disposed between the part of the first flexible layer in the peripheral area of the lower substrate and the first surface of the lower substrate in the first area of the lower substrate.

\* \* \* \* \*